(12) United States Patent  
Chen et al.

(10) Patent No.: US 9,024,354 B2  
(45) Date of Patent: May 5, 2015

(54) SILICON-CONTROLLED RECTIFICATION DEVICE WITH HIGH EFFICIENCY

(71) Applicant: Amazing Microelectronic Corp., New Taipei (TW)

(72) Inventors: Tung-Yang Chen, Hsinchu County (TW); James Jeng-Jie Peng, Taoyuan County (TW); Woei-Lin Wu, Hsinchu County (TW); Ryan Hsin-Chin Jiang, Taipei (TW)

(73) Assignee: Amazing Microelectronics Corp., New Taipei (TW)

( * ) Notice: Subject to any disclaimer, the term of this patent is extended or adjusted under 35 U.S.C. 154(b) by 130 days.

(21) Appl. No.: 13/959,882

(22) Filed: Aug. 6, 2013

(65) Prior Publication Data

US 2015/0041848 A1    Feb. 12, 2015

(51) Int. Cl.
*H01L 29/66* (2006.01)
*H01L 29/74* (2006.01)
*H01L 29/861* (2006.01)

(52) U.S. Cl.
CPC .......... *H01L 29/7436* (2013.01); *H01L 29/861* (2013.01)

(58) Field of Classification Search
CPC .............. H01L 29/7436; H01L 29/747; H01L 27/0262; H01L 27/0817; H01L 29/7393; H01L 31/1113; H01L 29/7395; H01L 29/0696; H01L 29/1095; H01L 29/7397; H01L 29/66333; H01L 25/073; H01L 25/074; H01L 2924/00; H01L 2224/48247; H01L 2924/00014; H01L 2224/48091; H01L 2924/13091; H01L 2224/48137; H01L 2924/1306; H01L 2924/01079; H01L 2924/01046; H01L 2924/01078; H01L 2924/3011; H01L 2924/0002; H01L 29/87; H01L 29/0692
USPC .......... 257/119, 139, 658, 925; 438/109, 134, 438/208
See application file for complete search history.

(56) References Cited

U.S. PATENT DOCUMENTS

| | | | |
|---|---|---|---|
| 5,973,367 A * | 10/1999 | Williams | .............. 257/365 |
| 6,492,208 B1 * | 12/2002 | Cheng et al. | ............ 438/133 |
| 7,777,248 B1 | 8/2010 | Boyd et al. | |
| 8,164,112 B2 | 4/2012 | Lai et al. | |
| 2003/0102485 A1 | 6/2003 | Chen et al. | |
| 2013/0307020 A1 * | 11/2013 | Reinprecht | .............. 257/173 |

FOREIGN PATENT DOCUMENTS

| TW | 449904 B | 8/2001 |
|---|---|---|
| TW | I264107 B | 10/2006 |

* cited by examiner

*Primary Examiner* — Michelle Mandala

(74) *Attorney, Agent, or Firm* — Rosenberg, Klein & Lee

(57) ABSTRACT

A silicon-controlled rectification device with high efficiency is disclosed, which comprises a P-type region surrounding an N-type region. A first P-type heavily doped area is arranged in the N-type region and connected with a high-voltage terminal. A plurality of second N-type heavily doped areas is arranged in the N-type region. A plurality of second P-type heavily doped areas is closer to the second N-type heavily doped areas than the first N-type heavily doped area and arranged in the P-type region. At least one third N-type heavily doped area is arranged in the P-type region and connected with a low-voltage terminal. Alternatively or in combination, the second N-type heavily doped areas and the second P-type heavily doped areas are respectively arranged in the P-type region and the N-type region.

5 Claims, 25 Drawing Sheets

SILICON-CONTROLLED RECTIFICATION DEVICE WITH HIGH EFFICIENCY

BACKGROUND OF THE INVENTION

1. Field of the Invention

The present invention relates to a rectification device, particularly to a silicon-controlled rectification device with high efficiency.

2. Description of the Related Art

Because the IC device sizes have been shrunk to nanometer scale, the consumer electronics, like the laptop and mobile devices, have been designed to be much smaller than ever. Without suitable protection devices, the functions of these electronics could be reset or even damaged under ESD (Electrostatic Discharge) events. ESD devices are used in many integrated circuits to discharge high voltage received by external pins before the high voltage damages internal devices. One type of ESD devices uses an SCR (silicon-controlled rectifier).

FIG. 1 shows such a conventional SCR ESD device, which includes: an N well 10 and a P well 12 located in a P substrate 14, a high density P+ doped region 16 and a high density N+ doped region 18 located in the N well 10, and a high density P+ doped region 20 and a high density N+ doped region 22 located in the P well 12. In this SCR ESD device, the P+ doped region 16, the N+ doped region 18, the N well 10, and the P well 12 constitute a PNP transistor; the N well 10, the P well 12, and the N+ doped region 22 constitute an NPN transistor. An external pad, PAD, is coupled to the P+ doped region 16 and the N+ doped region 18, and, an external grounding pad, GND, is coupled to the P+ doped region 20 and the N+ doped region 22. Therefore, when the PAD receives a high voltage, the SCR ESD device is triggered to conduct a current to the GND. However, the trigger voltage and the holding voltage of this SCR are fixed. This design does not provide adjustable trigger voltage and holding voltage to satisfy the requirement of ESD protection. In addition, the ESD current of the SCR is not uniformly distributed which results in low ESD efficiency.

To overcome the abovementioned problems, the present invention provides a silicon-controlled rectification device with high efficiency, so as to solve the afore-mentioned problems of the prior art.

SUMMARY OF THE INVENTION

A primary objective of the present invention is to provide a silicon-controlled rectification device with high efficiency, which uses uniformly-arranged N-type and P-type heavily doped areas to establish a plurality of uniform electrostatic discharge (ESD) paths and adjust a holding voltage and a trigger voltage, thereby satisfying the requirement of ESD protection.

To achieve the abovementioned objectives, the present invention provides a silicon-controlled rectification device with high efficiency, which comprises a P-type substrate and an N-type well is arranged in the P-type substrate. A first P-type heavily doped area and at least one first N-type heavily doped area are arranged in the N-type well and connected with a high-voltage terminal. A plurality of second N-type heavily doped areas is uniformly arranged in the N-type well, and cooperates with the first N-type heavily doped area to be arranged at an outer side of the first P-type heavily doped area. There is a plurality of second P-type heavily doped areas arranged in the P-type substrate and uniformly arranged at an outer side of the N-type well. The second P-type heavily doped areas are closer to the second N-type heavily doped areas than the first N-type heavily doped area. At least one third N-type heavily doped area is arranged in the P-type substrate and connected with a low-voltage terminal, and the second P-type heavily doped areas are arranged between the third N-type heavily doped area and the N-type well. The second N-type heavily doped areas and the second P-type heavily doped areas are configured to comply with certain specifications included a first condition, a second condition or both. The first condition defines the second N-type heavily doped areas extending toward the third N-type heavily doped area and arranged in the P-type substrate, and the second condition defines the second P-type heavily doped areas extending toward the first P-type heavily doped area and arranged in the N-type well.

The present invention also provides another silicon-controlled rectification device with high efficiency, which comprises an N-type substrate, and a P-type well is arranged in the N-type substrate to surround an N-type region of the N-type substrate. A first P-type heavily doped area and at least one first N-type heavily doped area are arranged in the N-type region and connected with a high-voltage terminal. A plurality of second N-type heavily doped areas is uniformly arranged in the N-type region, and cooperates with the first N-type heavily doped area to be arranged at an outer side of the first P-type heavily doped area. There is a plurality of second P-type heavily doped areas arranged in the P-type well and uniformly arranged at an outer side of the N-type region. The second P-type heavily doped areas are closer to the second N-type heavily doped areas than the first N-type heavily doped area. At least one third N-type heavily doped area is arranged in the P-type well and connected with a low-voltage terminal, and the second P-type heavily doped areas are arranged between the third N-type heavily doped area and the N-type region. The second N-type heavily doped areas and the second P-type heavily doped areas are configured to comply with certain specifications included a first condition, a second condition or both. The first condition defines the second N-type heavily doped areas extending toward the third N-type heavily doped area and arranged in the P-type well, and the second condition defines the second P-type heavily doped areas extending toward the first P-type heavily doped area and arranged in the N-type region.

Below, the embodiments are described in detail in cooperation with the drawings to make easily understood the technical contents, characteristics and accomplishments of the present invention.

DETAILED DESCRIPTION OF THE INVENTION

Figure 1:
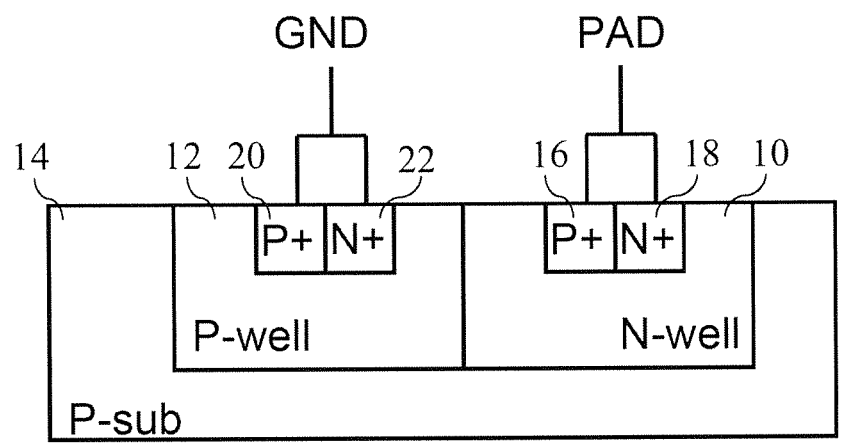
FIG. 1 is a sectional view schematically showing a traditional silicon-controlled rectifier (SCR)

Refer to FIG. 2 and FIGS. 3(a)-3(c). The first embodiment of the present invention is introduced as below. The first embodiment comprises a P-type substrate 24 and an N-type well 26 is arranged in the P-type substrate 24. A first P-type heavily doped area 28 and at least one first N-type heavily doped area 30 are arranged in the N-type well 26 and connected with a high-voltage terminal VDD. The silicon-controlled rectification is not triggered on in normal operation due to the first N-type heavily doped area 30 connected with the high-voltage terminal VDD. At least one first N-type heavily doped area 30 is exemplified by two first N-type heavily doped areas 30 in the embodiment. A plurality of second N-type heavily doped areas 32 is uniformly arranged in the N-type well 26. The second N-type heavily doped areas 32 and the first N-type heavily doped areas 30 are peripherally arranged at an outer side of the first P-type heavily doped area 28. The second N-type heavily doped areas 32 are divided into two first groups. The second N-type heavily doped areas 32 of each first group is arranged in a line along a sidewall of the N-type well 26, and the two first groups are respectively arranged at two opposite sides of the first P-type heavily doped area 28. The first N-type heavily doped areas 30 and the first groups are interlaced arranged.

A plurality of second P-type heavily doped areas 34 is uniformly arranged in the P-type substrate 24. The second P-type heavily doped areas 34 are divided into two second groups. The second P-type heavily doped areas 34 of each second group is arranged in a line along the sidewall of the N-type well 26, and the two second groups are respectively arranged at two opposite sides of the N-type well 26. The second P-type heavily doped areas 34 of one group is closer to the second N-type heavily doped areas 32 of one group than the first N-type heavily doped area 30 and uniformly arranged at an outer side of the N-type well 26. At least one third N-type heavily doped area 36 is arranged in the P-type substrate 24 and connected with a low-voltage terminal VSS. At least one third N-type heavily doped area 36 is exemplified by two third N-type heavily doped areas 36. The second P-type heavily doped areas 34 are arranged between the third N-type heavily doped area 36 and the N-type well 26. The third N-type heavily doped area 36 with two ends thereof extend toward the N-type well 26 to shorten widths between the third N-type heavily doped area 36 and the N-type well 26. The second N-type heavily doped areas 32 and the second P-type heavily doped areas 34 can establish a plurality of uniform electrostatic discharge (ESD) paths to enhance ESD efficiency.

Figure 2:
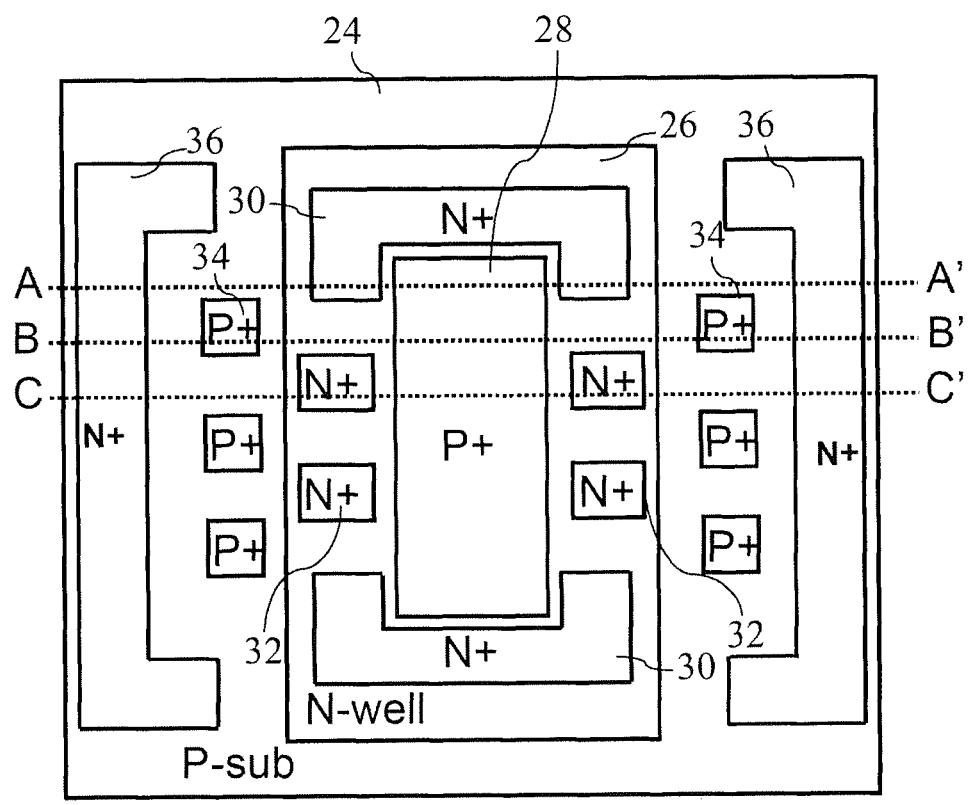
FIG. 2 is a layout schematically showing a silicon-controlled rectification device according to the first embodiment of the present invention.
Figure 3A:
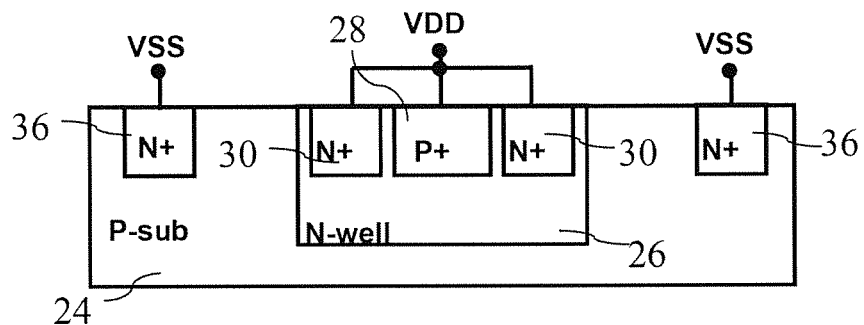
FIGS. 3(a)-3(c) are respectively sectional views taken along Lines A-A', B-B' and C-C' of FIG. 2.
Figure 3B:
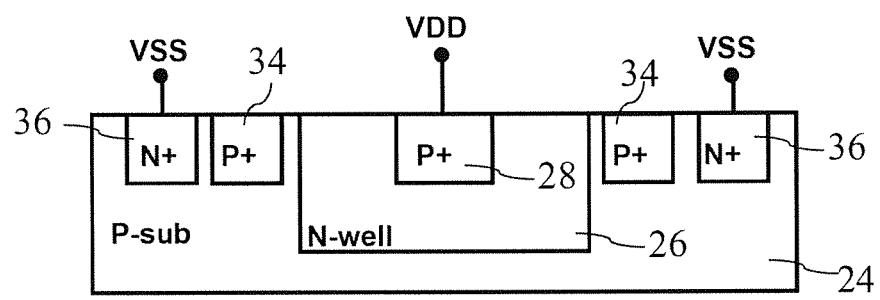
Figure 3C:
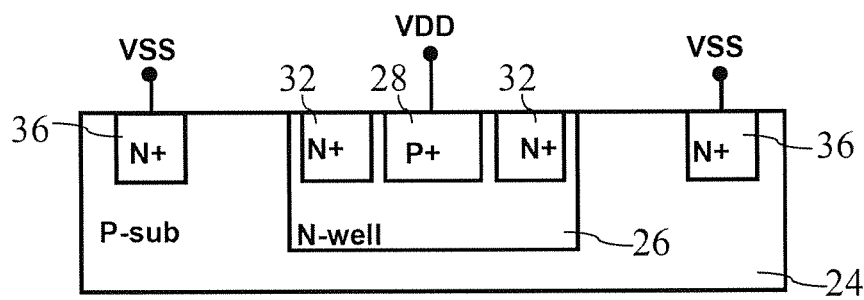
Figure 4:
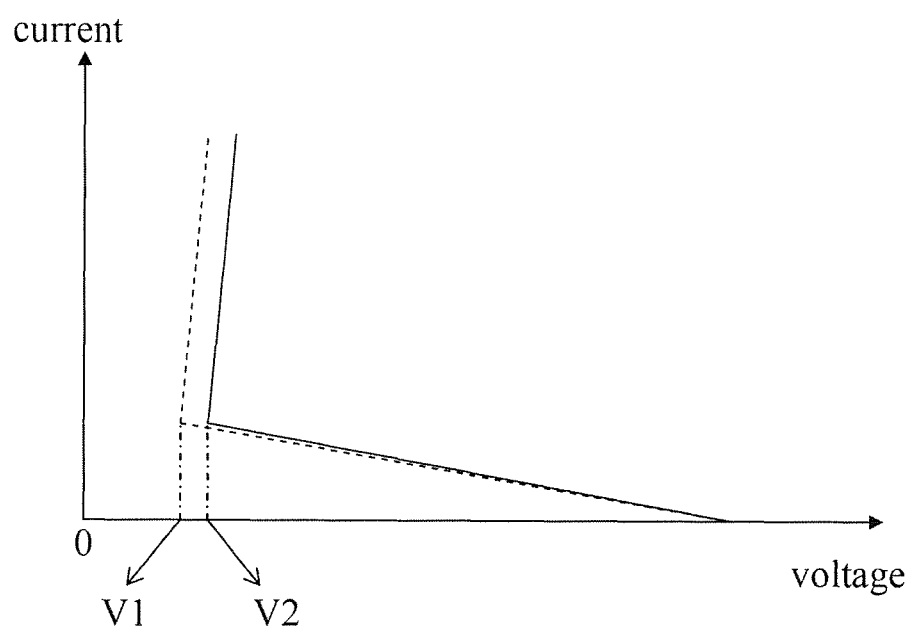
FIG. 4 is a current-voltage curve according to the first embodiment of the present invention.

Refer to FIG. 2 and FIG. 4. The solid line and the dash line respectively denote the first embodiment and the traditional silicon-controlled rectifier (SCR). In the traditional technology, the SCR uses a P-type heavily doped area arranged in an N-type well and an N-type heavily doped area arranged in a P-type well. Since the second N-type heavily doped areas 32 and the second P-type heavily doped areas 34 of the present invention can establish a plurality of uniform electrostatic discharge (ESD) paths and the widths between the third N-type heavily doped area 36 and the N-type well 26 are shortened, the holding voltage V2 of the first embodiment is higher than the holding voltage V1 of the traditional SCR. As a result, the ESD efficiency of the present invention is improved. In other words, the more the number of the second N-type heavily doped areas 32 and the second P-type heavily doped areas 34, the higher the holding voltage. And, the longer the shortened widths, the higher the holding voltage.

Figure 5:
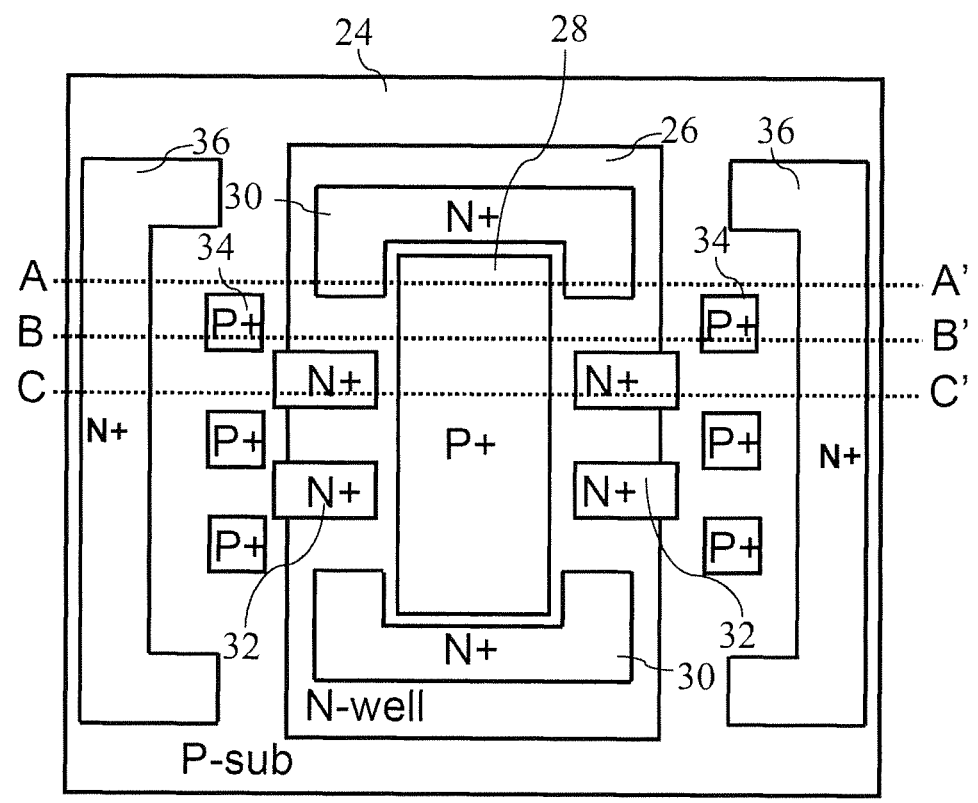
FIG. 5 is a layout schematically showing a silicon-controlled rectification device according to the second embodiment of the present invention.
Figure 6A:
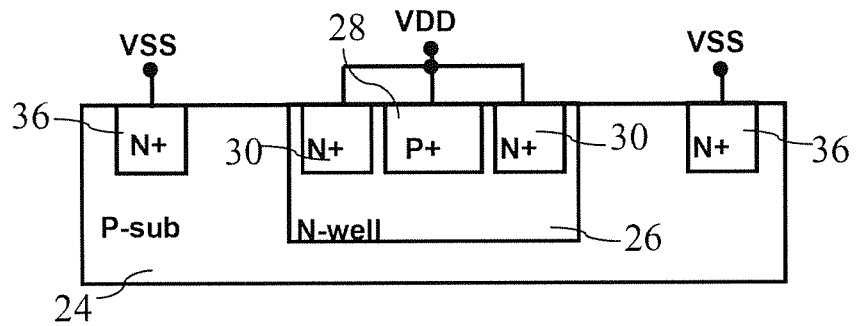
FIGS. 6(a)-6(c) are respectively sectional views taken along Lines A-A', B-B' and C-C' of FIG. 5.
Figure 6B:
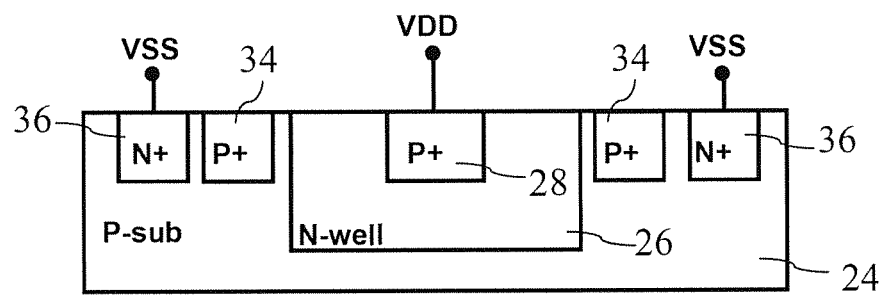
Figure 6C:
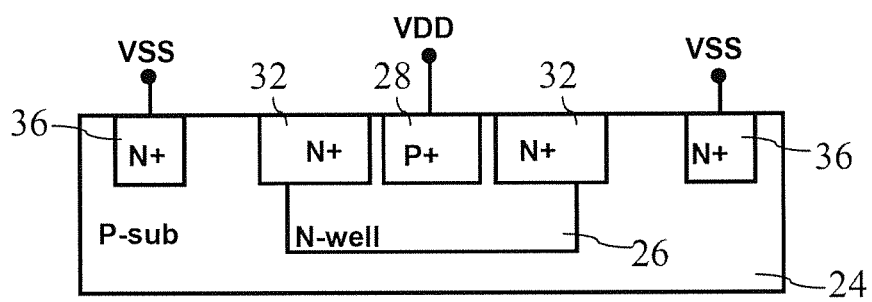
Figure 7:
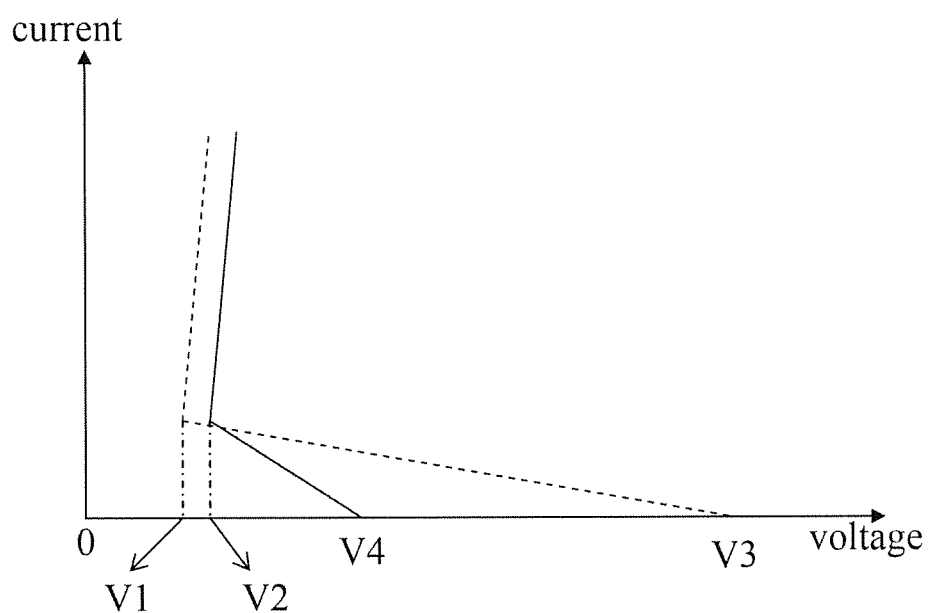
FIG. 7 is a current-voltage curve according to the second embodiment of the present invention.

Refer to FIG. 5 and FIGS. 6(a)-6(c). The second embodiment of the present invention is introduced as below. The second embodiment is different from the first embodiment in the positions that the second N-type heavily doped areas 32 occupy. In the second embodiment, the second N-type heavily doped areas 32 extend toward the third N-type heavily doped area 36 and are arranged in the P-type substrate 24 and the N-type well 26. Refer to FIG. 5 and FIG. 7. The solid line and the dash line respectively denote the second embodiment and the traditional SCR. Since the PN junctions of the second N-type heavily doped areas 32 are closer to third N-type heavily doped area 36 than the first embodiment, the trigger voltage V4 of the second embodiment is lower than the trigger voltage V3 of the traditional SCR.

Figure 8:
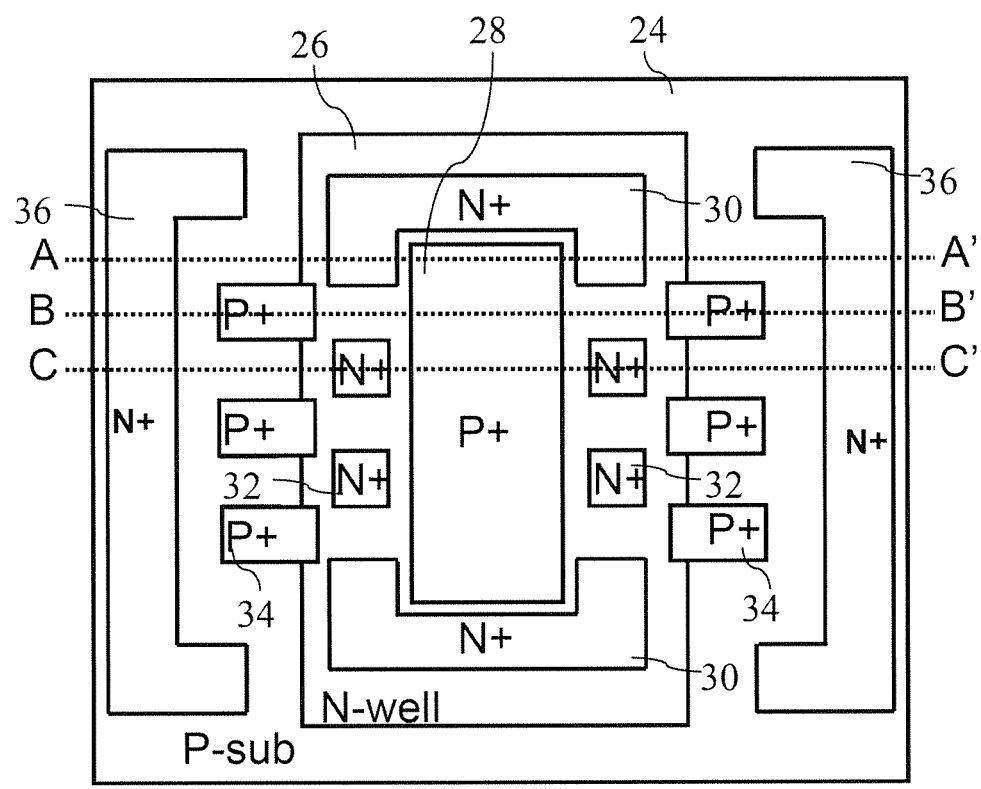
FIG. 8 is a layout schematically showing a silicon-controlled rectification device according to the third embodiment of the present invention.
Figure 9A:
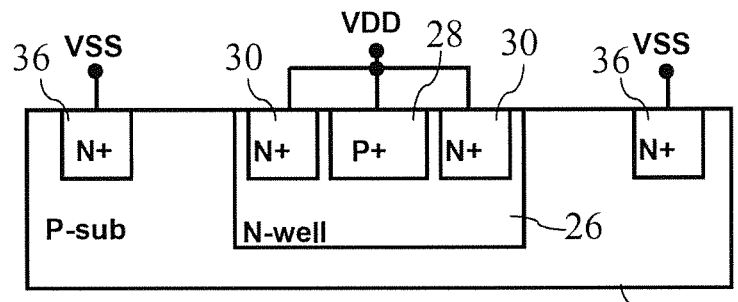
FIGS. 9(a)-9(c) are respectively sectional views taken along Lines A-A', B-B' and C-C' of FIG. 8.
Figure 9B:
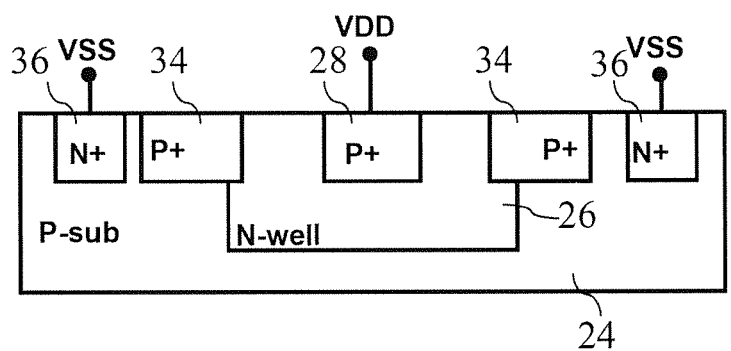
Figure 9C:
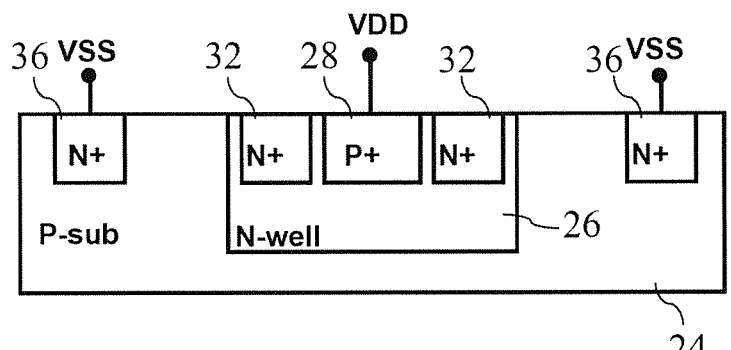
Figure 10:
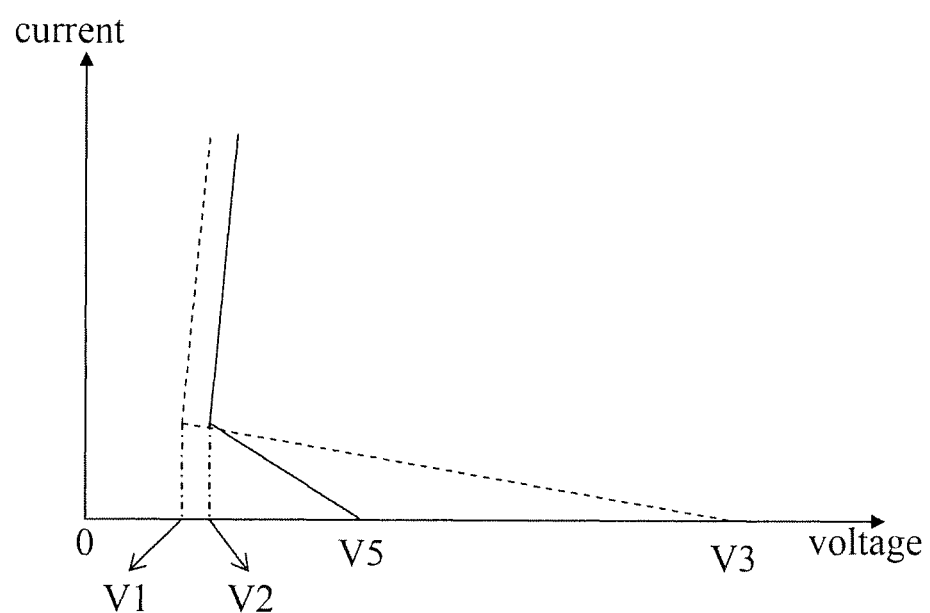
FIG. 10 is a current-voltage curve according to the third embodiment of the present invention.

Refer to FIG. 8 and FIGS. 9(a)-9(c). The third embodiment of the present invention is introduced as below. The third embodiment is different from the first embodiment in the positions that the second P-type heavily doped areas 34 occupy. In the third embodiment, the second P-type heavily doped areas 34 extend toward the first P-type heavily doped area 28 and are arranged in the P-type substrate 24 and the N-type well 26. Refer to FIG. 8 and FIG. 10. The solid line and the dash line respectively denote the third embodiment and the traditional SCR. Since the PN junctions of the second P-type heavily doped areas 34 are closer to first P-type heavily doped area 28 than the first embodiment, the trigger voltage V5 of the sixth embodiment is lower than the trigger voltage V3 of the traditional SCR.

Figure 11:
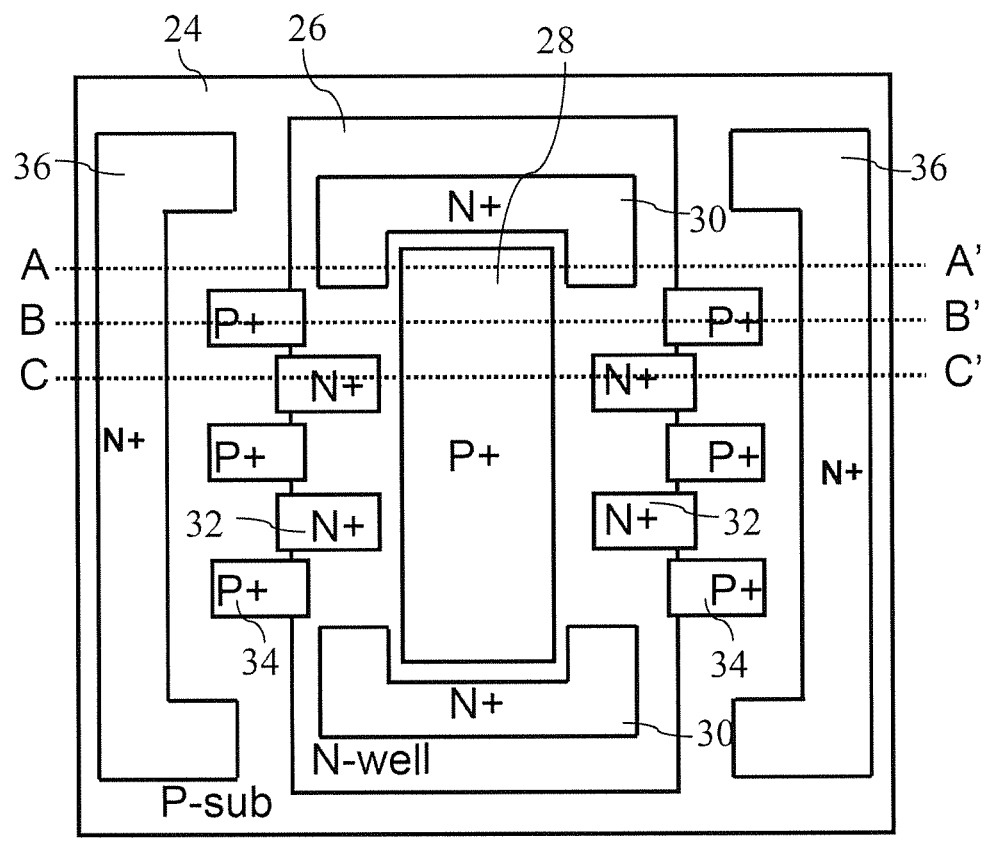
FIG. 11 is a layout schematically showing a silicon-controlled rectification device according to the fourth embodiment of the present invention.
Figure 12A:
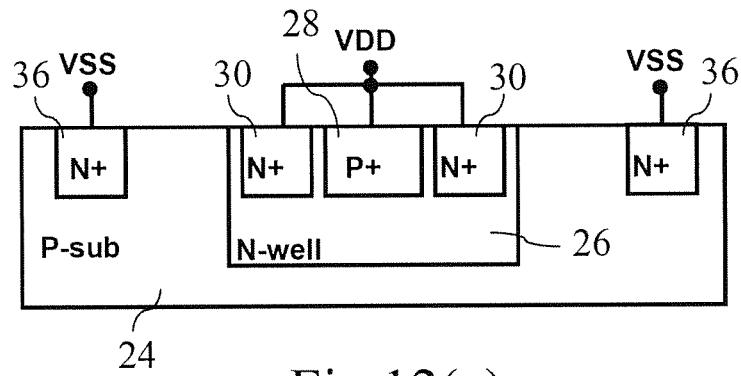
FIGS. 12(a)-12(c) are respectively sectional views taken along Lines A-A', B-B' and C-C' of FIG. 11.
Figure 12B:
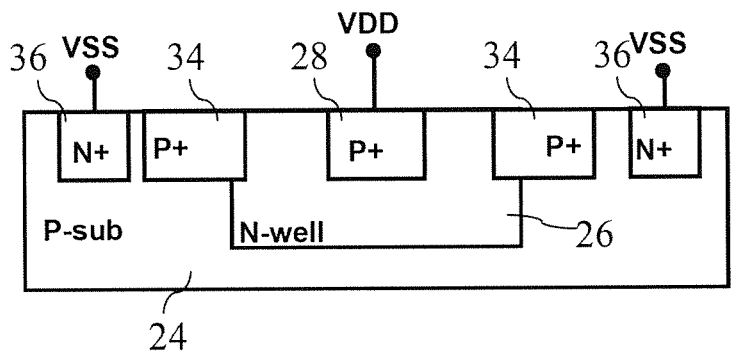
Figure 12C:
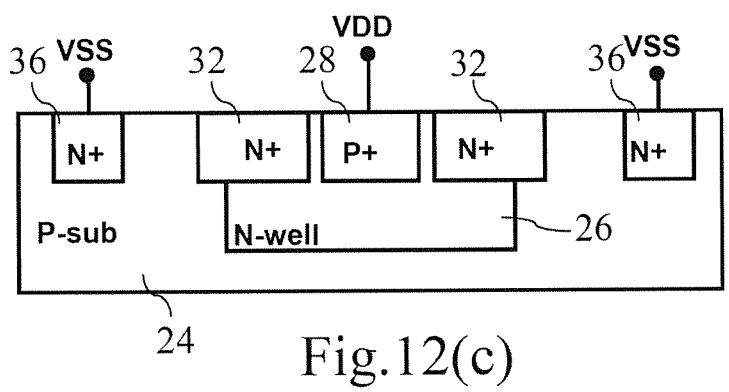
Figure 13:
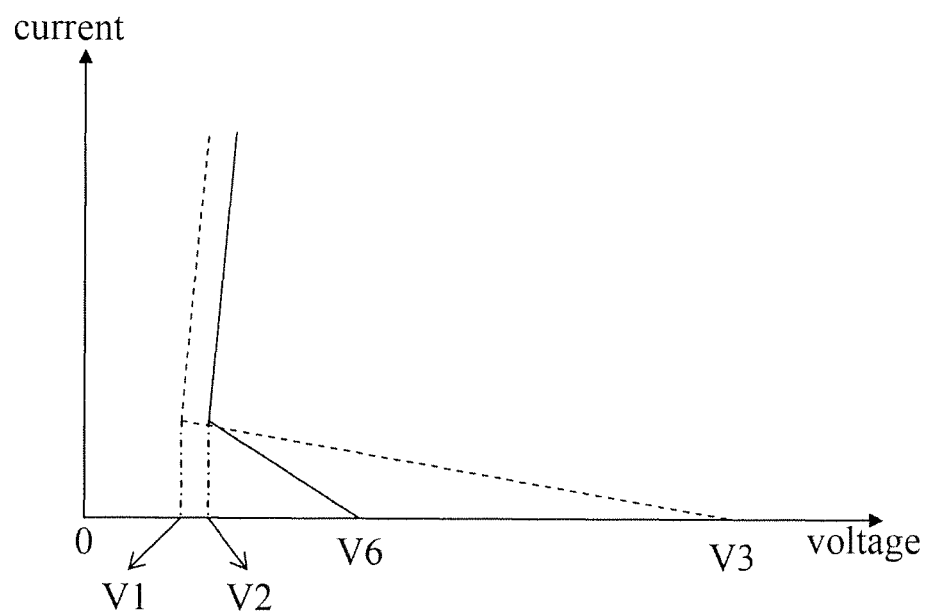
FIG. 13 is a current-voltage curve according to the fourth embodiment of the present invention.

Refer to FIG. 11 and FIGS. 12(a)-12(c). The fourth embodiment of the present invention is introduced as below. The fourth embodiment is different from the first embodiment in the positions that the second N-type heavily doped areas 32 and the second P-type heavily doped areas 34 occupy. In the fourth embodiment, the second N-type heavily doped areas 32 extend toward the third N-type heavily doped area 36 and are arranged in the P-type substrate 24 and the N-type well 26, and the second P-type heavily doped areas 34 extend toward the first P-type heavily doped area 28 and are arranged in the P-type substrate 24 and the N-type well 26. Refer to FIG. 11 and FIG. 13. The solid line and the dash line respectively denote the fourth embodiment and the traditional SCR. Since the PN junctions of the second N-type heavily doped areas 32 are closer to third N-type heavily doped area 36 than the first embodiment, and the PN junctions of the second P-type heavily doped areas 34 are closer to first P-type heavily doped area 28 than the first embodiment. As a result, the trigger voltage V6 of the fourth embodiment is lower than the trigger voltage V3 of the traditional SCR.

Refer to FIG. 14 and FIGS. 15(a)-15(c). The fifth embodiment of the present invention is introduced as below. The fifth embodiment comprises an N-type substrate 38 and a P-type well 40 is arranged in the N-type substrate 38 to surround an N-type region 42 of the N-type substrate 38. A first P-type heavily doped area 44 and at least one first N-type heavily doped area 46 are arranged in the N-type region 42 and connected with a high-voltage terminal VDD. The silicon-controlled rectification is not triggered on in normal operation due to the first N-type heavily doped area 46 connected with the high-voltage terminal VDD. At least one first N-type heavily doped area 46 is exemplified by two first N-type heavily doped areas 46 in the embodiment. A plurality of second N-type heavily doped areas 48 is uniformly arranged in the N-type region 42. The second N-type heavily doped areas 48 and the first N-type heavily doped areas 46 are peripherally arranged at an outer side of the first P-type heavily doped area 44. The second N-type heavily doped areas 48 are divided into two first groups. The second N-type heavily doped areas 48 of each first group is arranged in a line along a sidewall of the N-type region 42, and the two first groups are respectively arranged at two opposite sides of the first P-type heavily doped area 44. The first N-type heavily doped areas 46 and the first groups are interlaced arranged.

A plurality of second P-type heavily doped areas 50 is uniformly arranged in the P-type well 40. The second P-type heavily doped areas 50 are divided into two second groups. The second P-type heavily doped areas 50 of each second group is arranged in a line along the sidewall of the N-type region 42, and the two second groups are respectively arranged at two opposite sides of the N-type region 42. The second P-type heavily doped areas 50 of one group is closer to the second N-type heavily doped areas 48 of one group than the first N-type heavily doped area 46 and uniformly arranged at an outer side of the N-type region 42. At least one third N-type heavily doped area 52 is arranged in the P-type substrate 38 and connected with a low-voltage terminal VSS. At least one third N-type heavily doped area 52 is exemplified by two third N-type heavily doped areas 52. The second P-type heavily doped areas 50 are arranged between the third N-type heavily doped area 52 and the N-type region 42. The third N-type heavily doped area 52 with two ends thereof extend toward the N-type region 42 to shorten widths between the third N-type heavily doped area 52 and the N-type region 42.

The second N-type heavily doped areas 48 and the second P-type heavily doped areas 50 can establish a plurality of uniform ESD paths to enhance the ESD efficiency.

Figure 14:
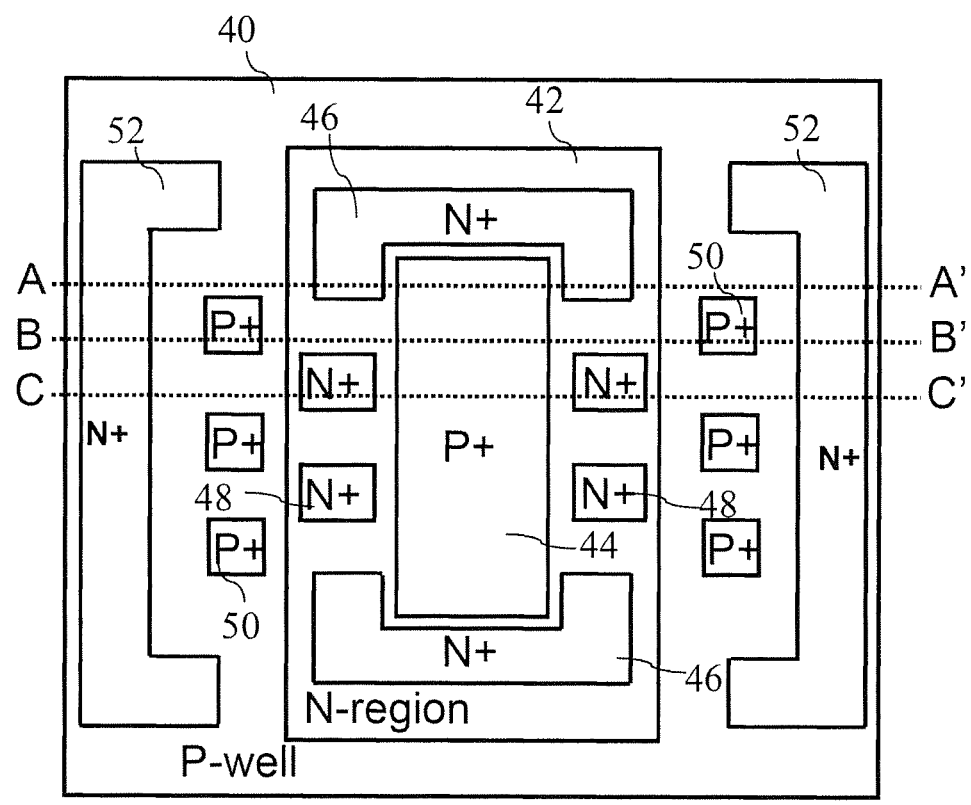
FIG. 14 is a layout schematically showing a silicon-controlled rectification device according to the fifth embodiment of the present invention.
Figure 15A:
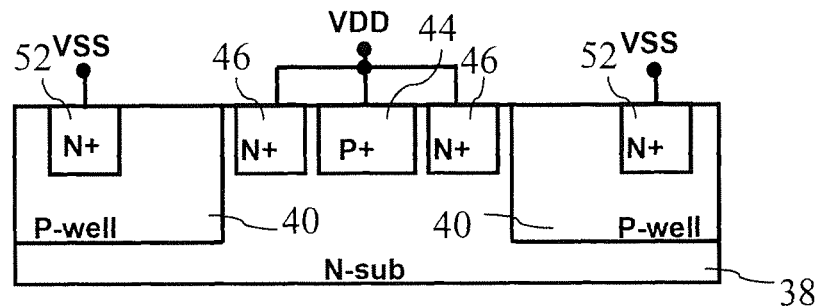
FIGS. 15(a)-15(c) are respectively sectional views taken along Lines A-A', B-B' and C-C' of FIG. 14.
Figure 15B:
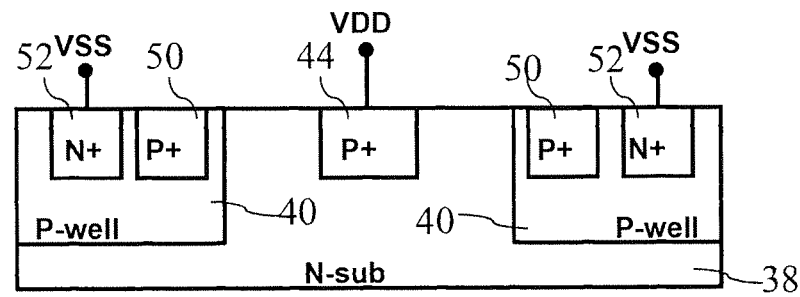
Figure 15C:
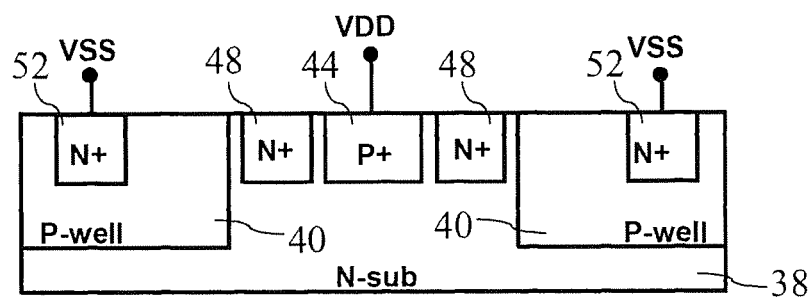
Figure 16:
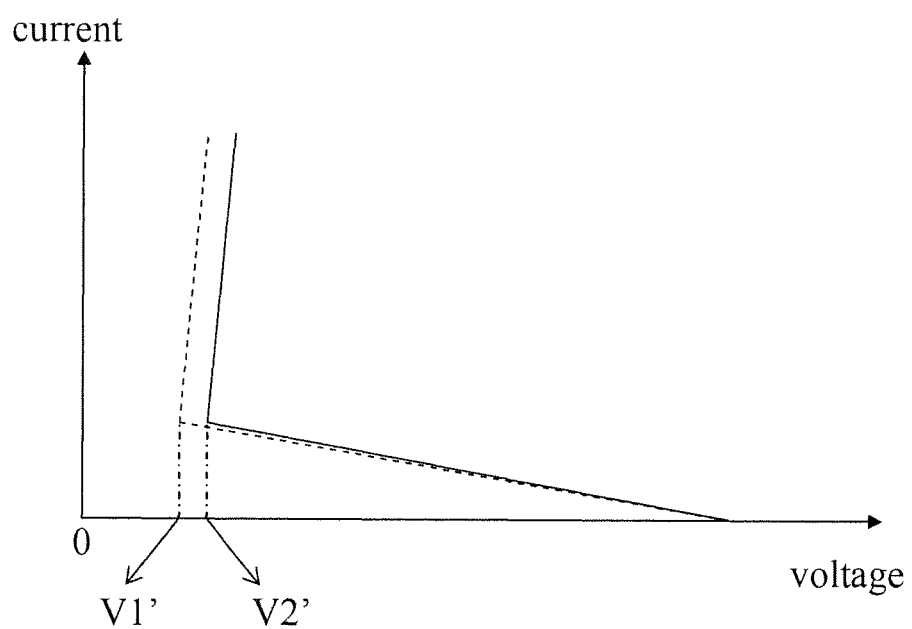
FIG. 16 is a current-voltage curve according to the fifth embodiment of the present invention.

Refer to FIG. 14 and FIG. 16. The solid line and the dash line respectively denote the fifth embodiment and the traditional SCR. Since the second N-type heavily doped areas 48 and the second P-type heavily doped areas 50 of the present invention can establish a plurality of uniform ESD paths and the widths between the third N-type heavily doped area 52 and the N-type region 42 are shortened, the holding voltage V2' of the fifth embodiment is higher than the holding voltage V1' of the traditional SCR. As a result, the ESD efficiency of the present invention is improved. In other words, the more the number of the second N-type heavily doped areas 48 and the second P-type heavily doped areas 50, the higher the holding voltage. And, the longer the shortened width, the higher the holding voltage.

Figure 17:
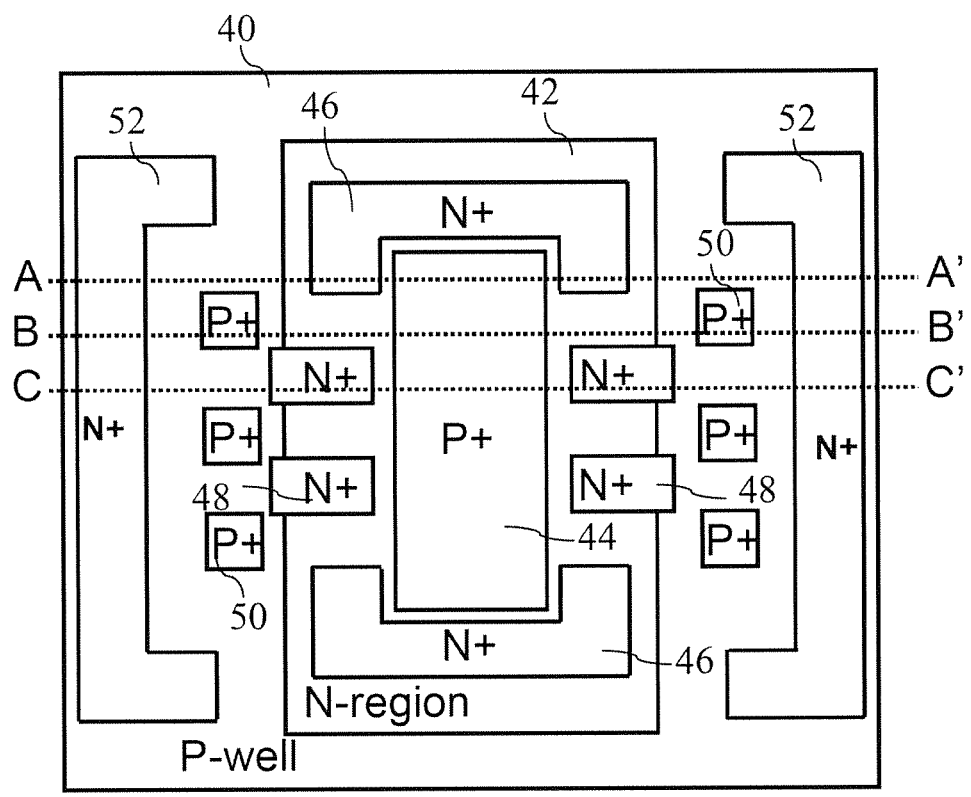
FIG. 17 is a layout schematically showing a silicon-controlled rectification device according to the sixth embodiment of the present invention.
Figure 18A:
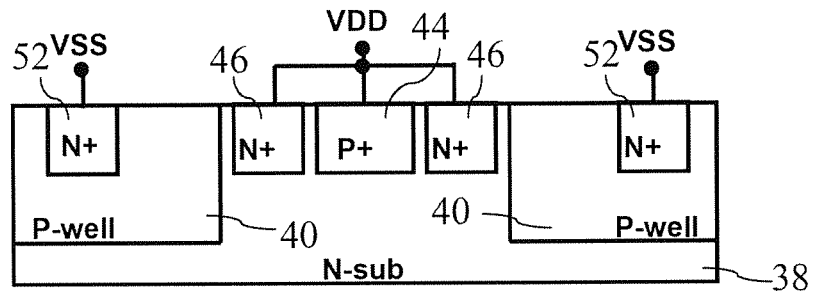
FIGS. 18(a)-18(c) are respectively sectional views taken along Lines A-A', B-B' and C-C' of FIG. 17.
Figure 18B:
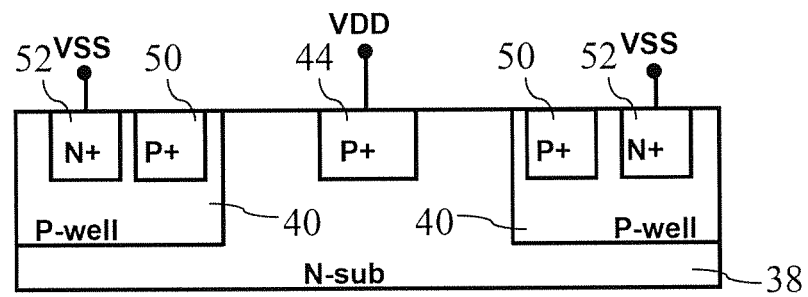
Figure 18C:
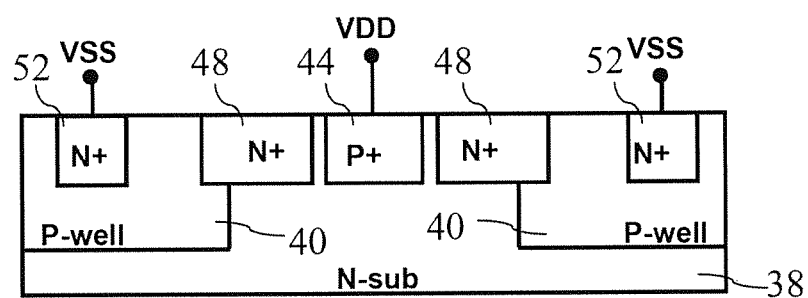
Figure 19:
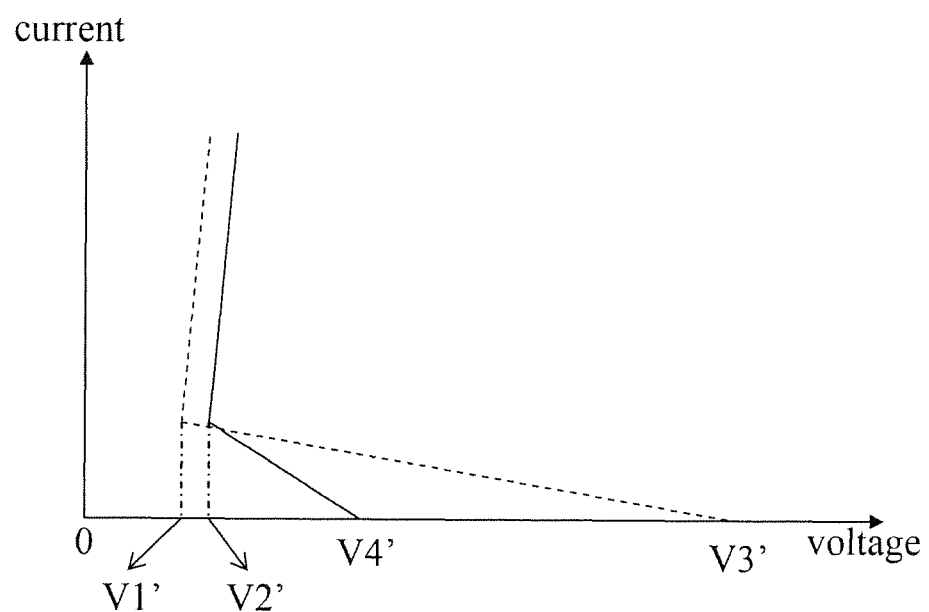
FIG. 19 is a current-voltage curve according to the sixth embodiment of the present invention.

Refer to FIG. 17 and FIGS. 18(a)-18(c). The sixth embodiment of the present invention is introduced as below. The sixth embodiment is different from the fifth embodiment in the positions that the second N-type heavily doped areas 48 occupy. In the sixth embodiment, the second N-type heavily doped areas 48 extend toward the third N-type heavily doped area 52 and are arranged in the P-type well 40 and the N-type region 42. Refer to FIG. 17 and FIG. 19. The solid line and the dash line respectively denote the sixth embodiment and the traditional SCR. Since the PN junctions of the second N-type heavily doped areas 48 are closer to third N-type heavily doped area 52 than the fifth embodiment, the trigger voltage V4' of the sixth embodiment is lower than the trigger voltage V3' of the traditional SCR.

Figure 20:
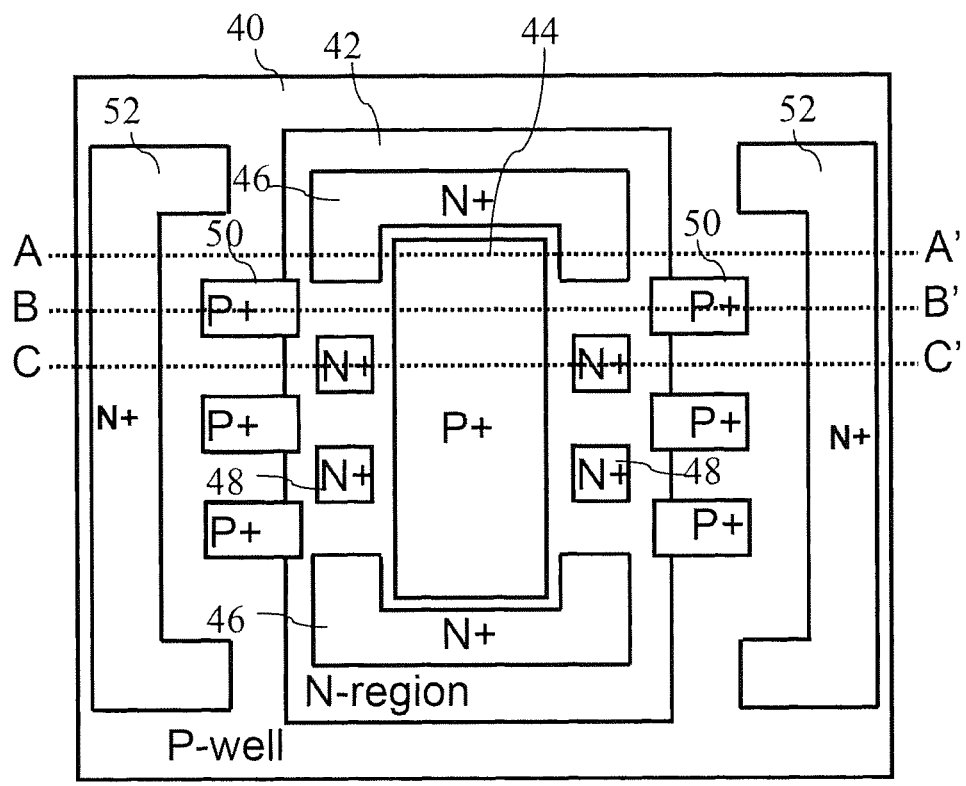
FIG. 20 is a layout schematically showing a silicon-controlled rectification device according to the seventh embodiment of the present invention.
Figure 21A:
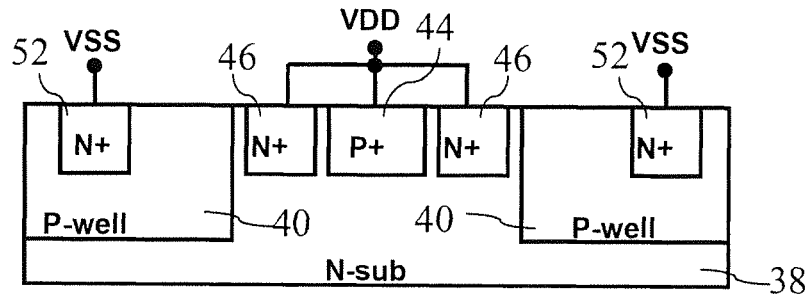
FIGS. 21(a)-21(c) are respectively sectional views taken along Lines A-A', B-B' and C-C' of FIG. 20.
Figure 21B:
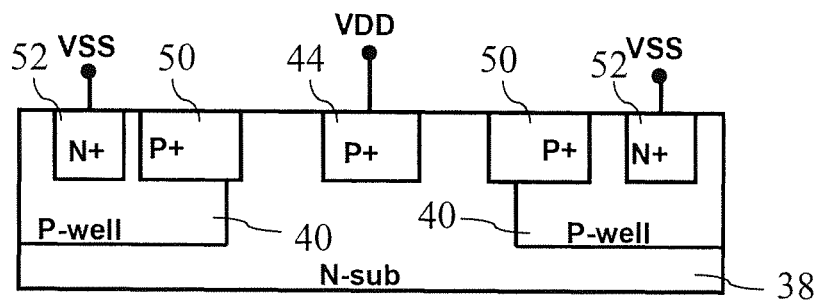
Figure 21C:
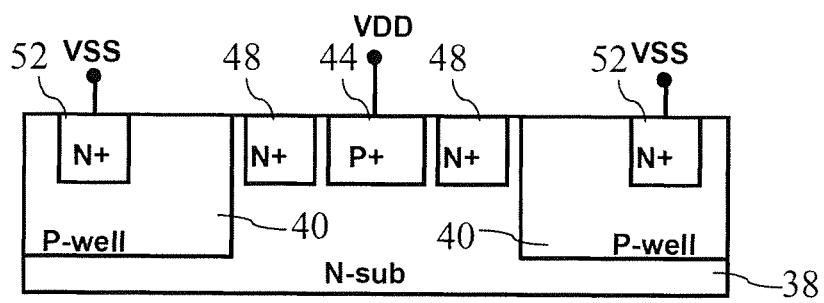
Figure 22:
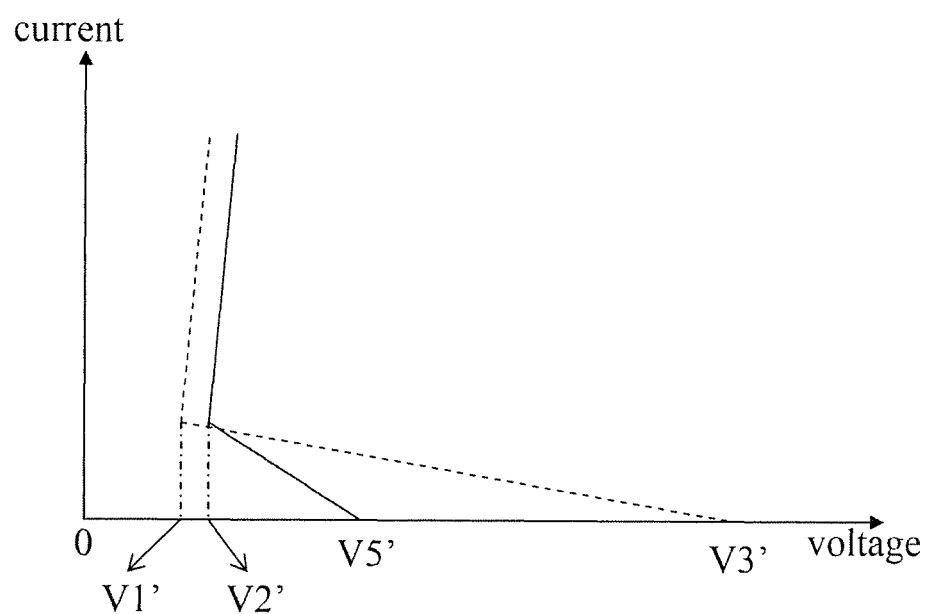
FIG. 22 is a current-voltage curve according to the seventh embodiment of the present invention.

Refer to FIG. 20 and FIGS. 21(a)-21(c). The seventh embodiment of the present invention is introduced as below. The seventh embodiment is different from the fifth embodiment in the positions that the second P-type heavily doped areas 50 occupy. In the seventh embodiment, the second P-type heavily doped areas 50 extend toward the first P-type heavily doped area 44 and are arranged in the P-type well 40 and the N-type region 42. Refer to FIG. 20 and FIG. 22. The solid line and the dash line respectively denote the seventh embodiment and the traditional SCR. Since the PN junctions of the second P-type heavily doped areas 50 are closer to first P-type heavily doped area 44 than the fifth embodiment, the trigger voltage V5' of the seventh embodiment is lower than the trigger voltage V3' of the traditional SCR.

Figure 23:
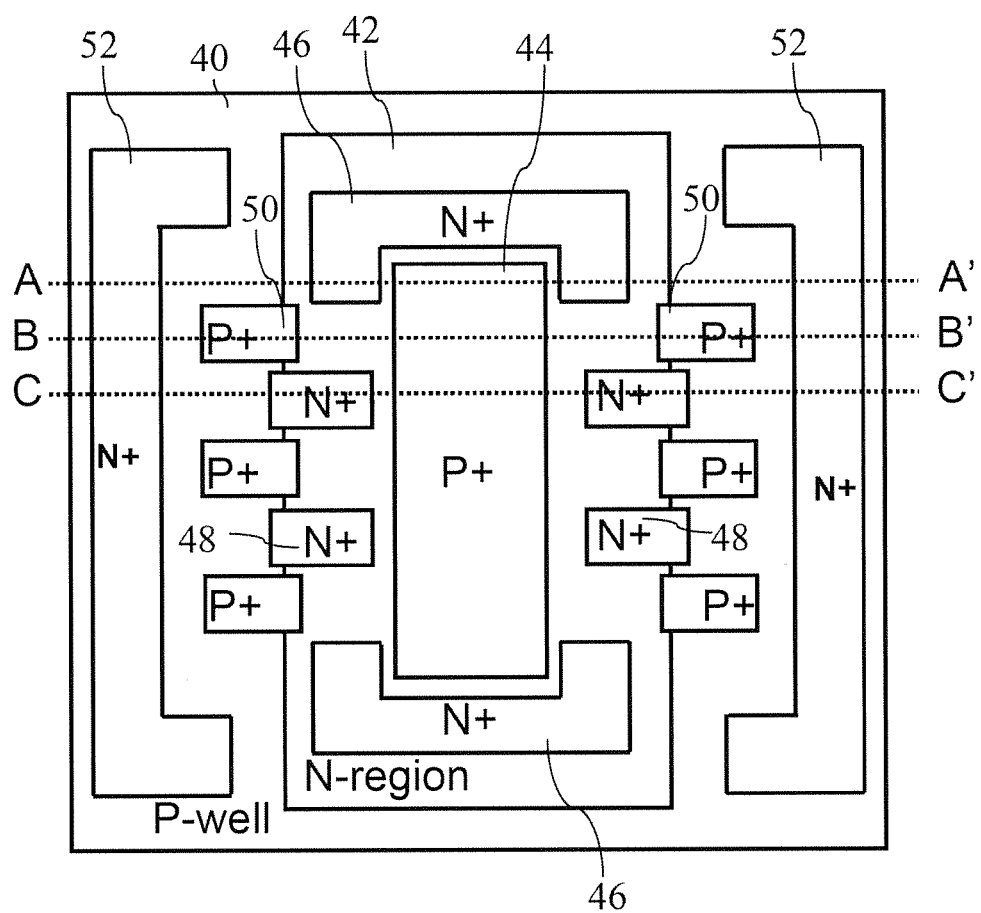
FIG. 23 is a layout schematically showing a silicon-controlled rectification device according to the eighth embodiment of the present invention.
Figure 24A:
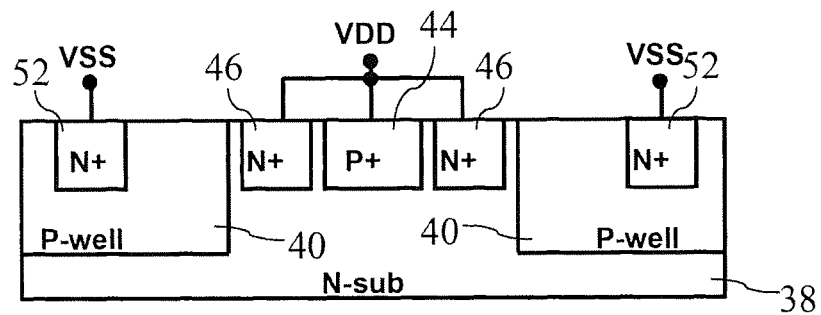
FIGS. 24(a)-24(c) are respectively sectional views taken along Lines A-A', B-B' and C-C' of FIG. 23.
Figure 24B:
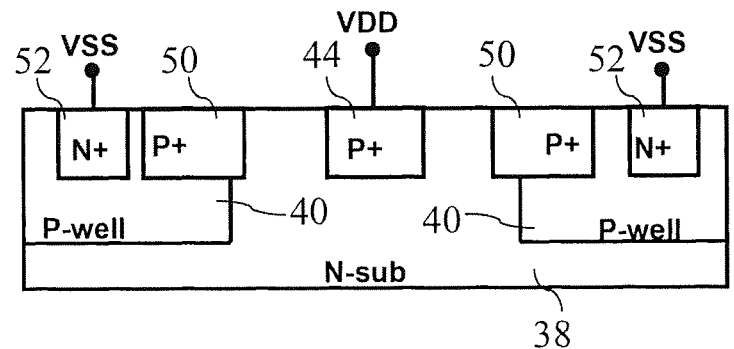
Figure 24C:
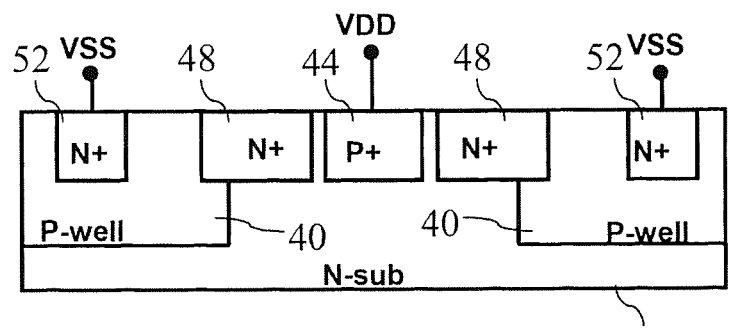
Figure 25:
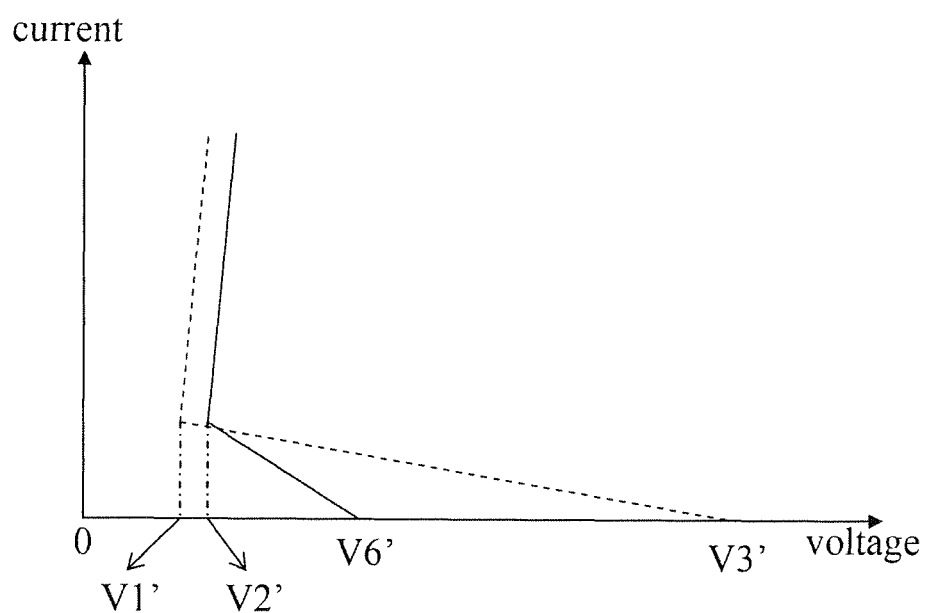
FIG. 25 is a current-voltage curve according to the eighth embodiment of the present invention.

Refer to FIG. 23 and FIGS. 24(a)-24(c). The eighth embodiment of the present invention is introduced as below. The eighth embodiment is different from the fifth embodiment in the positions that the second N-type heavily doped areas 48 and the second P-type heavily doped areas 50 occupy. In the eighth embodiment, the second N-type heavily doped areas 48 extend toward the third N-type heavily doped area 52 and are arranged in the P-type well 40 and the N-type region 42, and the second P-type heavily doped areas 50 extend toward the first P-type heavily doped area 44 and are arranged in the P-type well 40 and the N-type region 42. Refer to FIG. 23 and FIG. 25. The solid line and the dash line respectively denote the eighth embodiment and the traditional SCR. Since the PN junctions of the second N-type heavily doped areas 48 are closer to third N-type heavily doped area 52 than the fifth embodiment, and the PN junctions of the second P-type heavily doped areas 50 are closer to first P-type heavily doped area 44 than the fifth embodiment. As a result, the trigger voltage V6' of the eighth embodiment is lower than the trigger voltage V3' of the traditional SCR.

In conclusion, the present invention changes the number of uniformly-arranged N-type and P-type heavily doped areas to improve the ESD efficiency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A silicon-controlled rectification device with high efficiency, comprising:
   a P-type substrate;
   an N-type well arranged in said P-type substrate;
   a first P-type heavily doped area arranged in said N-type well and connected with a high-voltage terminal;
   at least one first N-type heavily doped area arranged in said N-type well and connected with said high-voltage terminal;
   a plurality of second N-type heavily doped areas uniformly arranged in said N-type well, and said second N-type heavily doped areas and said first N-type heavily doped area arranged at an outer side of said P-type heavily doped area;
   a plurality of second P-type heavily doped areas uniformly arranged in said P-type substrate, being closer to said second N-type heavily doped areas than said first N-type heavily doped area and uniformly arranged at an outer side of said N-type well; and
   at least one third N-type heavily doped area arranged in said P-type substrate and connected with a low-voltage terminal, and said second P-type heavily doped areas arranged between said third N-type heavily doped area and said N-type well, and said second N-type heavily doped areas and said second P-type heavily doped areas are configured to comply with certain specifications included a first condition, a second condition or both, and said first condition defines said second N-type heavily doped areas extending toward said third N-type heavily doped area and arranged in said P-type substrate, and said second condition defines said second P-type heavily doped areas extending toward said first P-type, heavily doped area and arranged in said N-type well.

2. The silicon-controlled rectification device with high efficiency according to claim 1, wherein said first N-type heavily dopes area and said second N-type heavily doped areas peripherally arranged at said outer side of said first P-type heavily doped area.

3. The silicon-controlled rectification device with high efficiency according to claim 1, wherein said at least one first N-type heavily doped area is two first N-type heavily doped areas, and said at least one third N-type heavily doped area is two third N-type heavily doped areas.

4. The silicon-controlled rectification device with high efficiency according to claim 1, wherein said second N-type heavily doped areas are arranged in a line along a sidewall of said N-type well, and said second P-type heavily doped areas are arranged in a line along said sidewall of said N-type well.

5. The silicon-controlled rectification device with high efficiency according to claim 1, wherein said third N-type heavily doped area with two ends thereof extend toward said N-type well to shorten widths between said third N-type heavily doped area and said N-type well.

* * * * *